United States Patent
Lee

(10) Patent No.: US 10,571,504 B2
(45) Date of Patent: Feb. 25, 2020

(54) DIAGNOSTIC SYSTEM FOR ELECTRIC POWER EQUIPMENT

(71) Applicant: LSIS CO., LTD., Anyang-si, Gyeonggi-do (KR)

(72) Inventor: Jinho Lee, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 255 days.

(21) Appl. No.: 15/611,687

(22) Filed: Jun. 1, 2017

(65) Prior Publication Data

US 2017/0356945 A1  Dec. 14, 2017

(30) Foreign Application Priority Data

Jun. 14, 2016 (KR) ........................ 10-2016-0073768

(51) Int. Cl.
*G01R 29/26* (2006.01)
*G01R 31/02* (2006.01)
(Continued)

(52) U.S. Cl.
CPC ......... *G01R 29/26* (2013.01); *G01R 19/2513* (2013.01); *G01R 23/15* (2013.01);
(Continued)

(58) Field of Classification Search
None
See application file for complete search history.

(56) References Cited

U.S. PATENT DOCUMENTS 5,200,737 A * 4/1993 Konishi ............. G01R 31/1254
  324/424
6,300,768 B1 * 10/2001 Kato .................. G01R 31/1254
  324/122

(Continued)

FOREIGN PATENT DOCUMENTS

CN  101975912 A   2/2011
CN  105122072 A  12/2015
(Continued)

OTHER PUBLICATIONS

JP-2013134156-A, translation (Year: 2013).*
(Continued)

*Primary Examiner* — Lina M Cordero
(74) *Attorney, Agent, or Firm* — K&L Gates LLP

(57) ABSTRACT

An electric power equipment comprises: a display module; a sensor module for outputting measurement data including a first noise signal measured from inside of the electric power equipment, a second noise signal measured from outside of the electric power equipment, a temperature signal of the electric power equipment, and a humidity signal of the electric power equipment; and a control module for diagnosing whether a partial discharge has occurred based on the measurement data, wherein the control module includes: a determination unit for determining whether a signal magnitude of the first noise signal is within a preset first reference range; an analysis unit for diagnosing an occurrence of the partial discharge, and for analyzing the signals according to the analysis algorithm; and a control unit for controlling a result information of the analyzing, and a maintenance and repair information, to be displayed.

7 Claims, 3 Drawing Sheets

(51) Int. Cl.
*G01R 31/12* (2006.01)
*G01R 19/25* (2006.01)
*G01R 23/15* (2006.01)
*G01R 29/08* (2006.01)
*G01R 31/34* (2006.01)
*G01R 31/40* (2014.01)
*G01R 31/00* (2006.01)

(52) U.S. Cl.
CPC ..... *G01R 29/0871* (2013.01); *G01R 29/0878* (2013.01); *G01R 29/0892* (2013.01); *G01R 31/027* (2013.01); *G01R 31/12* (2013.01); *G01R 31/343* (2013.01); *G01R 31/40* (2013.01); *G01R 31/003* (2013.01); *G01R 31/1254* (2013.01)

(56) References Cited

U.S. PATENT DOCUMENTS

| | | | | |
|---|---|---|---|---|
| 6,507,181 | B1 * | 1/2003 | Pakonen | G01R 31/12 324/536 |
| 7,112,968 | B1 * | 9/2006 | Nishizawa | G01R 31/1272 324/536 |
| 7,256,584 | B2 * | 8/2007 | Moriyama | G01R 31/1254 324/536 |
| 7,676,333 | B2 * | 3/2010 | Younsi | G01R 31/1227 324/458 |
| 7,782,063 | B2 * | 8/2010 | Ohtsuka | G01R 31/1272 324/501 |
| 10,317,451 | B2 * | 6/2019 | Yoshimura | G01R 31/1254 |
| 2002/0163344 | A1 * | 11/2002 | Rokunohe | G01R 31/1254 324/551 |
| 2004/0246000 | A1 * | 12/2004 | Kuppuswamy | G01R 31/1254 324/536 |
| 2009/0248327 | A1 * | 10/2009 | Montanari | G01R 31/1227 702/58 |
| 2010/0079148 | A1 | 4/2010 | Park | |
| 2010/0324746 | A1 | 12/2010 | Jeong | |
| 2011/0193563 | A1 * | 8/2011 | Higgins | G01R 31/1272 324/551 |
| 2012/0143533 | A1 | 6/2012 | Luna et al. | |
| 2013/0033214 | A1 * | 2/2013 | Obata | G01R 31/1227 318/490 |
| 2013/0271116 | A1 * | 10/2013 | Javora | G01R 31/1254 324/114 |
| 2013/0293383 | A1 * | 11/2013 | Ganesh | G01R 31/343 340/646 |
| 2015/0137827 | A1 * | 5/2015 | Cheng | G01R 31/1209 324/537 |
| 2016/0116520 | A1 * | 4/2016 | Di Stefano | G06N 3/10 702/58 |
| 2016/0139196 | A1 * | 5/2016 | Hoff | G01R 31/021 356/73.1 |
| 2016/0356852 | A1 * | 12/2016 | Lee | G01R 31/44 |
| 2019/0056447 | A1 * | 2/2019 | Candela | G01R 31/1272 |

FOREIGN PATENT DOCUMENTS

| | | | | |
|---|---|---|---|---|
| EP | 0520193 | A1 * | 12/1992 | ............ G01R 23/16 |
| EP | 1024573 | A2 | 8/2000 | |
| EP | 2466324 | A1 | 6/2012 | |
| JP | H05209922 | | 8/1993 | |
| JP | 2009-222537 | A | 10/2009 | |
| JP | 2012154730 | | 8/2012 | |
| JP | 2013134156 | A * | 7/2013 | |
| JP | 2013134156 | A | 7/2013 | |
| JP | 2014042406 | | 3/2014 | |
| KR | 709694 | B1 * | 4/2007 | |
| KR | 10-2014-0004398 | A | 1/2014 | |
| KR | 101417191 | | 8/2014 | |
| KR | 101519923 | | 5/2015 | |
| WO | 2012/084038 | A1 | 6/2012 | |

OTHER PUBLICATIONS

EP-0520193-A1, translation (Year: 1992).*
KR 709694 B1, translation (Year: 2007).*
Extended European Search Report dated Nov. 10, 2017 issued in related European Patent Application No. 17174674.6—12 Pages.
Korean Intellectual Property Office Search report dated Apr. 25, 2016, 8 pages.
Chinese Office Action for related Chinese Application No. 201710446417.4; action dated May 31, 2019; (10 pages).

* cited by examiner

DIAGNOSTIC SYSTEM FOR ELECTRIC POWER EQUIPMENT

CROSS-REFERENCE TO RELATED APPLICATION

Pursuant to 35 U.S.C. § 119(a), this application claims the benefit of earlier filing date of and right of priority to Korean Application No. 10-2016-0073768, filed on Jun. 14, 2016, the contents of which are all hearby incorporated by reference herein in its entirety.

BACKGROUND OF THE INVENTION

1. Field of the Invention

This disclosure relates to a diagnostic system for electric power equipment, and more particularly, to a diagnostic system for electric power equipment, capable of easily diagnosing a partial discharge of electric power equipment, in real time.

2. Background of the Invention

Generally, electric power equipment such as a power distributing switchgear, a gas-insulated switchgear (GIS), a switchgear and a transformer generates a partial discharge (PD) signal which is a radio frequency (RF) signal of a predetermined radio frequency band, due to a degradation of an insulating portion. Accordingly, a degradation of the electric power equipment may be diagnosed in advance by detecting and analyzing a partial discharge signal, thereby preventing a malfunction of the electric power equipment and an accident or damage.

The partial discharge phenomenon may mean an electric discharge in an insulating material filled between electrodes, and indicates a phenomenon that gas is ionized by receiving very high energy.

A partial discharge signal may have a characteristic that disappears after a voltage reaches a maximum value according to a signal magnitude and the occurrence number of a signal are gradually increased as an applied voltage is increased. And the partial discharge signal may have a characteristic that starts to occur again at a negative region as a polarity of the voltage is changed, and reaches another maximum value, and then the partial discharge disappears.

Patterns of the partial discharge may be classified into a protrusion pattern, a void pattern, a noise pattern, a floating pattern, a surface pattern, etc. according to an occurrence cause.

In case of the protrusion pattern, the partial discharge results from a damaged surface of an insulating material, a cable of an inferior insulated state, an air gap formed due to an adjacent cable, and a protruding conductor.

In case of the void pattern, the partial discharge results from an air gap between a bus bar and an insulating material, etc.

In case of the noise pattern, the partial discharge results from external noise due to a nearby motor and a radio set.

In case of the floating pattern, the partial discharge results from a loosened state of a bolt, a floating foreign material, a foreign material inside an insulating material, an ungrounded conductor, etc.

In case of the surface pattern, the partial discharge results from a damaged insulating material (an insulator or an insulating barrier) and a worn-out (decrepit) insulating material.

And if the partial discharge occurs from a transformer/on a transformer, an electric pulse current and an ultrasonic wave may be generated.

As a method for detecting such a partial discharge, have been developed a current detection method to detect a current pulse due to a partial discharge, and an Ultrasonic High Frequency (UHF) detection method to detect an UHF signal by installing an UHF sensor at an enclosure of a transformer. Further, has been used a method for determining whether a partial discharge has occurred or not, by combining the current detection method and the UHF detection method with each other.

As a measured partial discharge signal is analyzed through a diagnosis apparatus, a degradation of an insulating portion, a degradation of insulating oil, an insulation breakdown, etc. due to a partial discharge could be detected early.

However, the diagnosis apparatus has not considered that a partial discharge signal may be influenced even by environmental factors (a temperature, a humidity, etc.) inside electric power equipment.

Accordingly, required are an overall analysis on factors which can be measured in electric power equipment, and a diagnostic system capable of diagnosing a state of electric power equipment more accurately through such a overall analysis.

SUMMARY OF THE INVENTION

Therefore, an object of this disclosure is to provide a diagnostic system for electric power equipment, capable of easily diagnosing a partial electrical discharge of electric power equipment in real time, and capable of overall analyzing even environmental factors.

To achieve these and other advantages and in accordance with the purpose of this disclosure, as embodied and broadly described herein, there is provided an electric power equipment, comprising: a display module; a sensor module that outputs measurement data according to a first noise signal of a radio frequency band measured at inside of the electric power equipment, a second noise signal of a radio frequency band measured at outside of the electric power equipment, a temperature signal corresponding to a temperature of the electric power equipment, and a humidity signal corresponding to a humidity of the electric power equipment; and a control module that diagnoses whether a partial discharge has occurred on the electric power equipment based on the measurement data, and controls result information to be displayed on the display module if the partial discharge has occurred, the result information indicating an analysis result on the measurement data according to an analysis algorithm, wherein the control module comprises: a determination unit that determines whether a signal magnitude of the first noise signal is within a preset first reference range, if a signal magnitude difference between the first and second noise signals is more than a preset reference difference value; an analysis unit that diagnoses an occurrence of the partial discharge when the signal magnitude of the first noise signal is within the preset first reference range, and analyzes the first noise signal, the temperature signal and the humidity signal according to the analysis algorithm; and a control unit that controls the result information analyzed by the analysis unit, and a first maintenance and repair information corresponding to the result information, to be displayed on the display module.

According to a preferred aspect of this disclosure, the sensor module comprises: a first noise sensor that outputs the first noise signal; a second noise sensor that outputs the second noise signal; a temperature sensor that outputs the temperature signal; and a humidity sensor that outputs the humidity signal.

According to another preferred aspect of this disclosure, the control module further comprises a first pattern check unit that checks that the signal magnitude of the first noise signal is within a second reference range lower than the first reference range, and thereby diagnoses an occurrence of a partial discharge on the electric power equipment, if the signal magnitude of the first noise signal is out of the first reference range as a determination result by the determination unit, and the first pattern check unit outputs a first noise pattern data including the signal magnitude, a phase and an occurrence frequency of the first noise signal.

According to still another preferred aspect of this disclosure, the control unit is configured to control a second maintenance and repair information corresponding to the first noise pattern data, to be displayed on the display module.

According to still another preferred aspect of this disclosure, the second maintenance and repair information has its priority for maintenance and repair, later than that of the first maintenance and repair information.

According to still another preferred aspect of this disclosure, the control module further comprises: a second pattern check unit that outputs a second noise pattern data including the signal magnitude, a phase and an occurrence frequency of the first noise signal; a pattern determination unit that determines whether there exists a reference partial discharge pattern matching with the second noise pattern data; and an information generation unit that determines the first noise signal as an inner environment noise pattern similar to the partial discharge, generates change amount information in relation to a temperature change amount and a humidity change amount for a preset time or period, and outputs the generated information to the control unit, if there is no reference partial discharge pattern matching with the second noise pattern data.

According to still another preferred aspect of this disclosure, if there exists the reference partial discharge pattern matching with the second noise pattern data, the analysis unit is configured to apply the occurrence frequency, the temperature change amount and the humidity change amount of the first noise signal for the preset time or period, to the analysis algorithm, and output the result information indicating an analysis on whether an occurrence cause of the first noise signal is at least one of the temperature and the humidity.

According to still another preferred aspect of this disclosure, the control unit is configured to determine that the first noise signal is an inner noise signal which has not resulted from the partial discharge, based on the change amount information, generate noise information, and control the generated noise information on the display module to be displayed.

According to still another preferred aspect of this disclosure, the electric power equipment according to this disclosure further comprises a storage module that stores data according to the first and second noise signals, the temperature signal and the humidity signal in real time, and stores the result information and the maintenance and repair information.

According to still another preferred aspect of this disclosure, the electric power equipment according to this disclosure further comprises an input module that inputs, to the control module, a setting command including a command to set the first reference range.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this disclosure, illustrate exemplary embodiments and together with the description serve to explain the principles of the invention.

In the drawings.

DETAILED DESCRIPTION OF THE INVENTION

Figure 1:
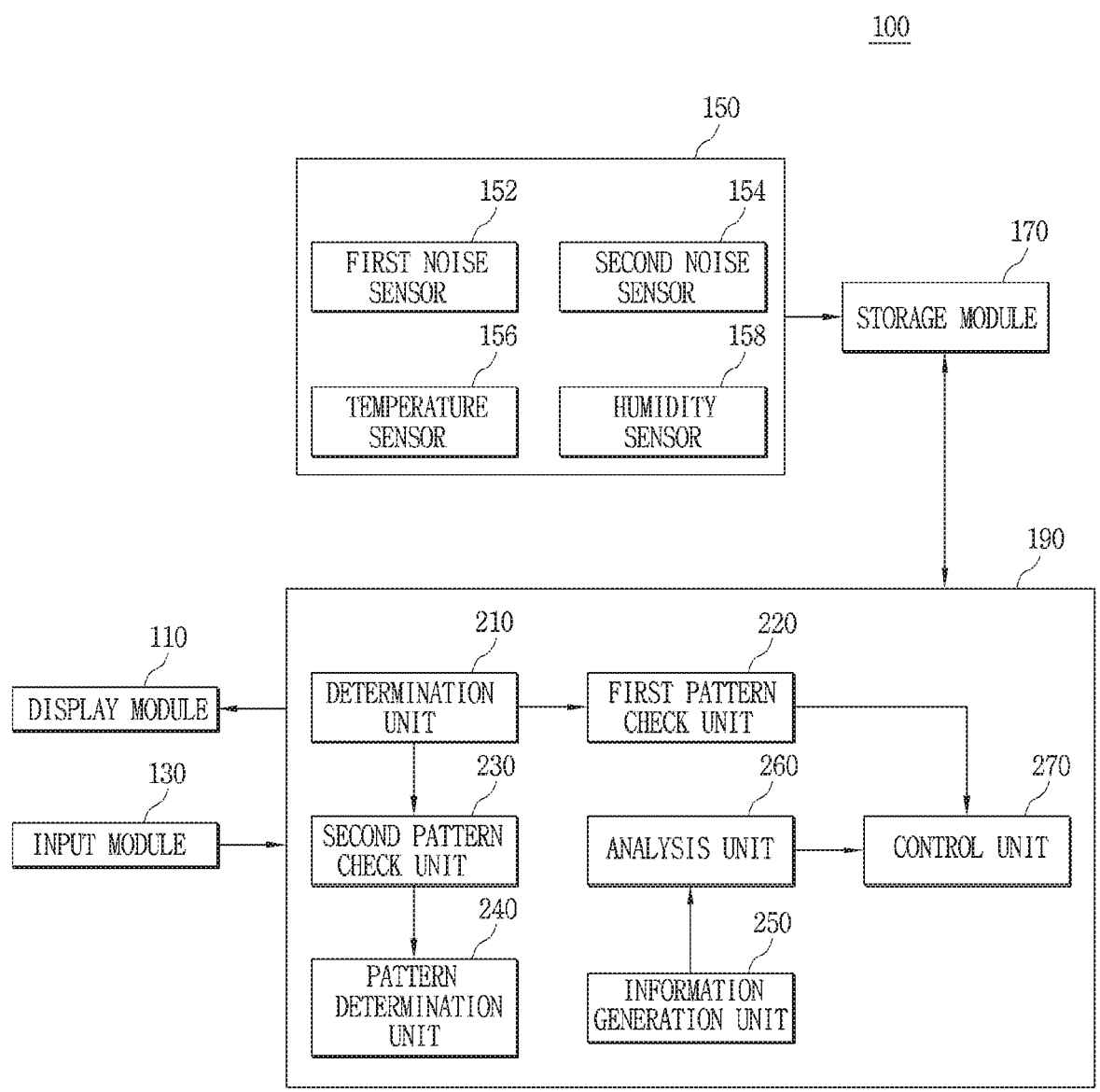
FIG. 1 is a block diagram showing a configuration of a diagnostic system for electric power equipment, according to an embodiment of the present invention.

Description will now be given in detail according to exemplary embodiments disclosed herein, with reference to the accompanying drawings. In general, a suffix such as "module" and "unit" may be used to refer to elements or components. Use of such a suffix herein is merely intended to facilitate description of the disclosure, and the suffix itself is not intended to give any special meaning or function.

In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. For the sake of brief description with reference to the drawings, the same or equivalent components may be provided with the same or similar reference numbers, and description thereof will not be repeated.

When it is determined that detailed descriptions of well-known functions or configurations in explaining embodiments of the present invention cause the gist of the present invention to be obscure, the detailed descriptions will be omitted. The following terms, defined with consideration of the functions in embodiments of the present invention, may become variable according to a user or operator's intention or a practice, etc. Therefore, the definition should be performed based on the entire content of the disclosure.

Combinations among blocks and steps shown in flow charts of the attached drawings may be performed by computer program instructions. The computer program instructions may be mounted to a processor of a general-purpose computer, a special-purpose computer or other programmable data processing equipment. Accordingly, the instructions performed through the processor of the computer or said other programmable data processing equipment generate means to perform functions explained in the respective blocks of the drawing or the respective steps of the flowchart. The computer program instructions can be stored in a computer-aided memory or a computer-readable memory for a computer or other programmable data processing equipment in order to implement a function in a specific manner. Therefore, the instructions stored in the computer-aided memory or the computer-readable memory can manufacture a product including instruction means which perform the functions explained in the respective blocks of the drawing or the respective steps of the flowchart. The computer program instructions can be mounted to a computer or other programmable data processing equipment. Therefore, it is possible that a series of operation steps are performed on the computer or said other programmable data processing equipment to generate processes executed by a computer. As a result, it is possible for the instructions to provide steps to execute the functions explained in the respective blocks of the drawing and the respective steps of the flowchart.

Further, each block or each step may represent a part of a module, a segment or a code which includes one or more executable instructions to execute one or more specific logic functions. Further, in some alternative embodiments, the functions mentioned in the respective blocks or the respective steps can be performed out of order. For instance, two consecutive blocks or steps can be performed simultaneously, or can be performed in a reverse order according to a corresponding function.

Hereinafter, the present invention will be explained in more detail with reference to the attached drawings.

FIG. 1 is a block diagram showing a configuration of a diagnostic system for electric power equipment, according to an embodiment of the present invention.

Referring to FIG. 1, the diagnostic system 100 for electric power equipment comprises a display module 110, an input module 130, a sensor module 150, a storage module 170 and a control module 190.

The display module 110 can display state information on a state of electric power equipment under control of the control module 190, and can display a maintenance and repair information.

In an embodiment, the display module 110 can be configured with at least one of a liquid crystal display (LCD) module and an light emitting device (LED) module including a plurality of light emitting devices (LEDs). And the display module 110 can display in a notification manner.

The input module 130 can input a first and second noise signals, a temperature signal, a humidity signal measured on the electric power equipment, and a command to the control module 190. Here, the command comprises an instruction to set a time or a period for diagnosis of a partial discharge by the control module 190, and to set a reference difference value and first and second reference ranges to be explained later.

Here, the input module 130 may be configured with a mobile terminal, a mobile phone, a mobile pad, a touch pad, etc., for example, and the present invention is not limited to this.

The sensor module 150 can transmit, to the control module 190, measurement data according to the first and second noise signals, the temperature signal and the humidity signal.

The sensor module 150 comprises a first noise sensor 152 that outputs a first noise signal of a radio frequency band measured in the electric power equipment, a second noise sensor 154 that outputs a second noise signal of a radio frequency band measured outside the electric power equipment, a temperature sensor 156 that outputs a temperature signal corresponding to a temperature of the electric power equipment, and a humidity sensor 158 that outputs a humidity signal corresponding to a humidity of the electric power equipment.

Here, the radio frequency band may be a frequency band of 300 MHz-800 MHz as a ultra high frequency (UHF) band, and may be a frequency band of 500 KHz-150 MHz as a very high frequency (VHF) band.

Here, the first noise signal can be at least one of vibrations generated from a plurality of components disposed in the electric power equipment, a partial discharge, and a noise received from the outside of the electric power equipment. The second noise signal can be at least one of external noise received from the outside of the electric power equipment, and noise generated at the inside of the electric power equipment and emitted to the outside.

In an embodiment, the first noise sensor 152, as a partial discharge sensor for sensing a partial discharge, can be configured with a VHF sensor or a UHF sensor.

Here, the first and second noise signals may be the same signals, or different signals.

That is, the first noise signal may be a signal measured as the second noise signal generated at the outside of the electric power equipment invaded into the equipment. On the contrary, the second noise signal may be a signal as the first noise signal is measured outside the electric power equipment.

The first and second noise sensors 152, 154 can transmit the first and second noise signals to at least one of the storage module 170 and the control module 190.

The temperature sensor 156 may be disposed near a component which operates sensitively to a temperature among the components disposed in the electric power equipment, or may be disposed at a position where a temperature can be easily measured.

The temperature sensor 156 can transmit a temperature signal measured in real time, to at least one of the storage module 170 and the control module 190.

The humidity sensor 158 may be disposed near a component which operates sensitively to a humidity among the components disposed in the electric power equipment, or may be disposed at a position where a humidity can be easily measured.

The humidity sensor 158 can transmit a humidity signal measured in real time, to at least one of the storage module 170 and the control module 190.

In a preferred embodiment, the first and second noise signals, the temperature signal and the humidity signal can be converted into digital data by an analogue-digital converter (not shown), and then the digital data may be stored in the storage module 170.

The control module 190 can read the data according to the first and second noise signals, the temperature signal and the humidity signal, the data stored in the storage module 170.

The storage module 170 can store in real time, the data according to the first and second noise signals, the temperature signal and the humidity signal provided from the first and second noise sensors 152, 154, the temperature sensor 156 and the humidity sensor 158.

Here, the storage module 170 can provide the stored data according to the first and second noise signals, the temperature signal and the humidity signal, under control of the control module 190.

According to a preferred embodiment, the control module 190 comprises a determination unit 210, a first pattern check unit 220, a second pattern check unit 230, a pattern determination unit 240, an information generation unit 250, an analysis unit 260 and a control unit 270.

The determination unit 210 can determine in real time whether a difference between the first and second noise signals (a difference between data according to the first and second noise signals) stored in the storage module 170 is more than a preset reference value or not.

If it is determined that the difference between the first and second noise signals is more than the preset reference value, the determination unit 210 may firstly determine that the first noise signal indicates a partial discharge occurring at the inside of the electric power equipment 100.

Then, if the difference between the first and second noise signals is more than the preset reference value, the determination unit 210 can determine whether a signal magnitude of the first noise signal is within a preset first reference range, and can output a determination result to at least one of the first and second pattern check units 220, 230.

If the signal magnitude of the first noise signal is out of the preset first reference range, the first pattern check unit 220 checks that the signal magnitude of the first noise signal is within a second reference range lower than the first reference range, thereby determining that a partial discharge has occurred on the electric power equipment. And the first pattern check unit 220 outputs a first noise pattern data including the signal magnitude, a phase and an occurrence frequency (a repetition rate) of the first noise signal, to at least one of the storage module 170 and the control unit 270.

In case of inputting the first noise pattern data, the control unit 270 can control a second maintenance and repair information corresponding to the first noise pattern data, to be displayed on the display module 110.

If the signal magnitude of the first noise signal is within the preset first reference range, the second pattern check unit 230 can output second noise pattern data including the signal magnitude, a phase and an occurrence frequency of the first noise signal.

Then, the pattern determination unit 240 may compare a phase characteristic of the second noise pattern data with a phase characteristic of a reference partial discharge pattern, thereby determining a partial discharge pattern to which the second noise pattern data belongs.

That is, the reference partial discharge pattern may include at least one of a protrusion pattern, a void pattern, a noise pattern, a floating pattern and a surface pattern.

The protrusion pattern has a characteristic that a noise signal occurs intensively near 90° and 270° among phases of 0°~360°.

Accordingly, if a noise signal according to the second noise pattern data has occurred intensively near 90° and 270°, the pattern determination unit 240 can determine that the second noise pattern data matches with a protrusion pattern as a result of the comparison.

The void pattern has a characteristic that a noise signal occurs intensively near 0°~70°, 175°~230° and 360°, among phases of 0°~360°.

Accordingly, if a noise signal according to the second noise pattern data has occurred intensively near 0°~70°, 175°~230° and 360°, the pattern determination unit 240 can determine that the second noise pattern data matches with a void pattern as a result of the comparison.

The noise pattern has a characteristic that a noise signal occurs uniformly at all phases (i.e., 0°~360°) among phases of 0°~360°.

Accordingly, if a noise signal according to the second noise pattern data has occurred uniformly at all phases (i.e., 0°~360°), the pattern determination unit 240 can determine that the second noise pattern data matches with a noise pattern as a result of the comparison.

The floating pattern has a characteristic that a noise signal occurs intensively near 15°~40°, 60°~70°, 200°~210° and 250°, among phases of 0°~360°.

Accordingly, if a noise signal based on the second noise pattern data has occurred intensively near 15°~40°, 60°~70°, 200°~210° and 250°, the pattern determination unit 240 can determine that the second noise pattern data matches with a floating pattern as a result of the comparison.

The surface pattern has a characteristic that a noise signal occurs intensively near 10°~80° and 190°~270° among phases of 0°~360°.

Accordingly, if a noise signal based on the second noise pattern data has occurred intensively near 10°~80° and 190°~270°, the pattern determination unit 240 can determine that the second noise pattern data matches with a surface pattern as a result of the comparison.

If there is no reference partial discharge pattern matching with the second noise pattern data, the information generation unit 250 may determine that a noise signal according to the second noise pattern data is an inner noise pattern similar to a partial discharge pattern. Then, the information generation unit 250 can generate change amount information on a temperature change amount and a humidity change amount for a preset time or period, and can output the generated information to the control unit 270.

Here, the control unit 270 can determine that the first noise signal is an inner environment noise signal which has not occurred due to a partial discharge, based on the change amount information, and can generate noise information and display the noise information on the display module 110.

If there is a reference partial discharge pattern corresponding to the second noise pattern data, the analysis unit 260 may apply an occurrence frequency, a temperature change amount and a humidity change amount of the first noise signal for a preset time or period, to a preset analysis algorithm (in other words a preset analysis program). As a result, the analysis unit 260 can output result information indicating an analysis on whether the first noise signal has occurred due to at least one of a temperature and a humidity.

That is, the analysis unit 260 can calculate the temperature change amount and the humidity change amount, based on the temperature and humidity data stored in the storage module 170 in real time for the preset time or period.

The temperature change amount and the humidity change amount may include a trend of a change amount, i.e., a shift pattern of a change amount.

More specifically, the analysis unit 260 checks whether an occurrence frequency of the first noise signal is increased (is an increase pattern) when a temperature change is an increase pattern. If the occurrence frequency of the first noise signal is not increased when the temperature change is an increase pattern, the analysis unit 260 may check whether the occurrence frequency of the first noise signal is increased when a humidity change is an increase pattern.

If the occurrence frequency of the first noise signal is increased when the temperature change is an increase pattern, the analysis unit 260 can output result information indicating that the first noise signal has occurred due to the temperature change.

Then, if the occurrence frequency of the first noise signal is increased when the humidity change is an increase pattern, the analysis unit 260 can output result information indicating that the first noise signal has occurred due to the humidity change.

If an increase pattern of the temperature change amount or the humidity change amount does not match with the increase pattern of the occurrence frequency of the first noise signal, the analysis unit 260 may output result information indicating that the first noise signal has occurred due to a partial discharge not a temperature change or a humidity change.

The control unit 270 can control a first maintenance and repair information corresponding to the result information analyzed by the analysis unit 260, to be displayed on the display module 110.

The first or second maintenance and repair information may include information which displays a component requiring an inspection among the components of the electric power equipment, based on a noise pattern determined by the pattern determination unit 240 (a partial discharge pattern, i.e., one of a protrusion pattern, a void pattern, a noise pattern, a floating pattern and a surface pattern) and based on a corresponding occurrence cause among the aforementioned occurrence causes.

The second maintenance and repair information may have its priority for maintenance and repair, later than that of the first maintenance and repair information. For instance, the second maintenance and repair information may be information requesting a mere inspection, whereas the first maintenance and repair information may be information requesting an immediate inspection.

The control unit 270 can control the first and second maintenance and repair information to be stored in the storage module 170.

Figure 2:
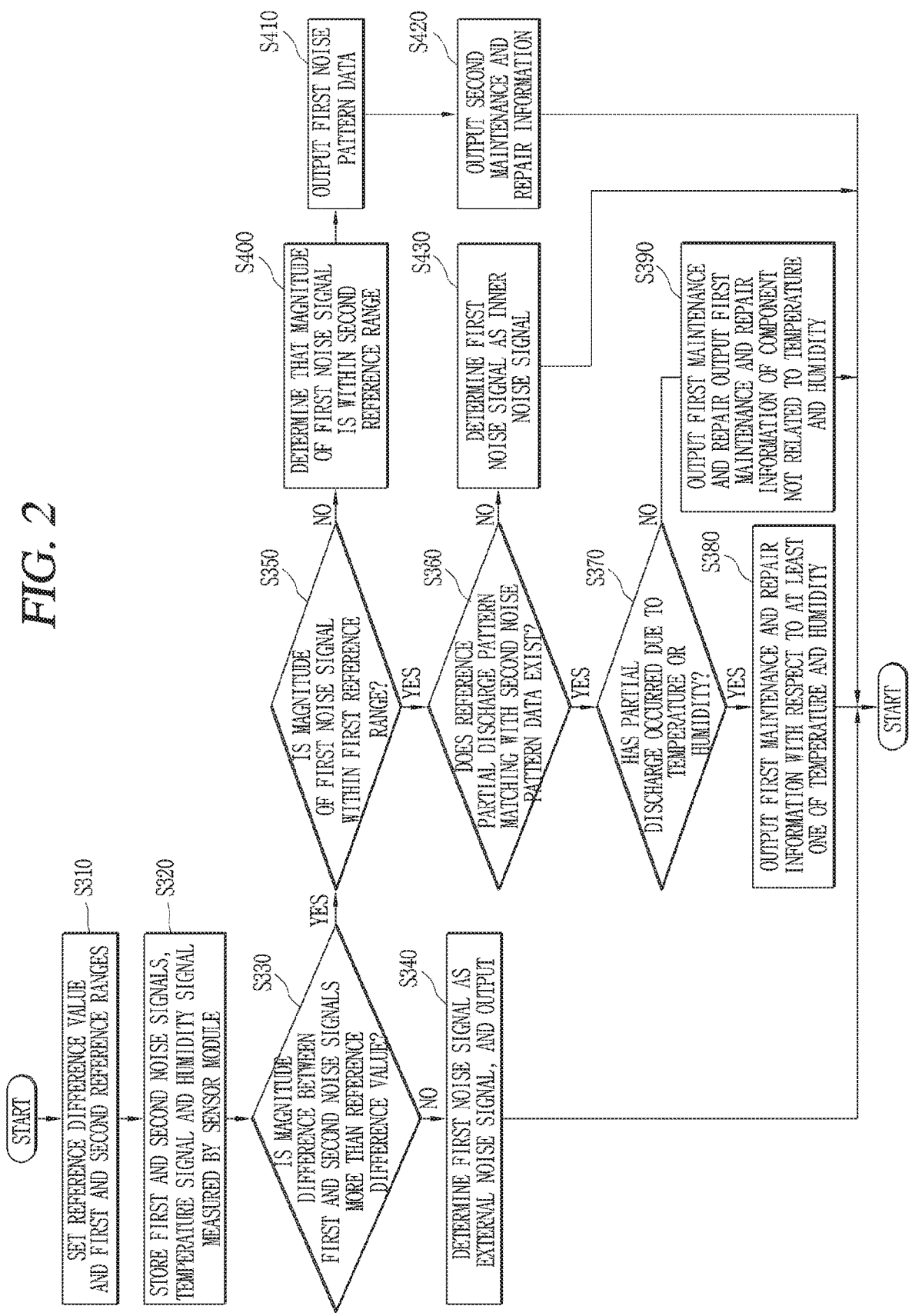
FIG. 2 is a flowchart showing an operation method of a diagnostic system for electric power equipment, according to the present invention.

FIG. 2 is a flowchart showing an operation method of the diagnostic system for electric power equipment according to the present invention.

Referring to FIG. 2, the control module 190 of the diagnostic system for electric power equipment can set a reference difference value and the first and second reference ranges, according to a command input from the input module 130 (S310).

Then, the sensor module 150 outputs the first and second noise signals, a temperature signal and a humidity signal measured on the electric power equipment in real time, to at least one of the storage module 170 and the control module 190 (S320).

The control module 190 determines whether a signal magnitude difference between the first and second noise signals is more than the set reference difference value or not (S330). If the signal magnitude difference between the first and second noise signals is less than the preset reference value, the determination unit 210 determines that the first noise signal has occurred at the outside of the electric power equipment (S340).

After S330, if the signal magnitude difference between the first and second noise signals is more than the preset reference value, the control module 190 determines whether the signal magnitude of the first noise signal is within the preset first reference range (S350).

If the signal magnitude of the first noise signal is within the preset first reference range, the control module 190 can determine whether the second noise pattern data including the signal magnitude, an occurrence frequency and a phase of the first noise signal matches with any one of the preset reference partial discharge patterns (S360).

If there is a reference partial discharge pattern matching the second noise pattern data, the control module 190 compares a change trend of an occurrence frequency of the first noise signal with a temperature change trend and a humidity change trend, based upon a preset analysis algorithm (a preset analysis program), for a preset time or period. Then, the control module 190 determines whether the first noise signal results from at least one of the temperature change and the humidity change (S370). If it is determined that the first noise signal results from at least one of the temperature change and the humidity change, the control module 190 can output a result information for maintaining and repairing a component related to at least one of the temperature and the humidity, to be displayed on the display module 110 (S380).

After S370, if it is determined that the first noise signal does not result from at least one of the temperature change and the humidity change, the control module 190 can output a result information for maintaining and repairing a component not related to the temperature and the humidity, to be displayed on the display module 110 (S390).

After S350, if the signal magnitude of the first noise signal is out of the preset first reference range, the control module 190 determines that the signal magnitude of the first noise signal is within a preset second reference range, thereby diagnosing that a partial discharge has occurred on the electric power equipment (S400). Then, the control module 190 outputs the first noise pattern data including the signal magnitude, a phase and an occurrence frequency of the first noise signal (S410). And the control module 190 can control a cause information corresponding to the reference partial discharge pattern matching with the first noise pattern data, to be displayed on the display module 110, as the second maintenance and repair information having a later priority than the first maintenance and repair information (S420).

After S360, if it is determined that there is no preset reference partial discharge pattern matching with the second noise pattern data, the control module 190 determines that the first noise signal is an inner noise signal (S430).

Figure 3:
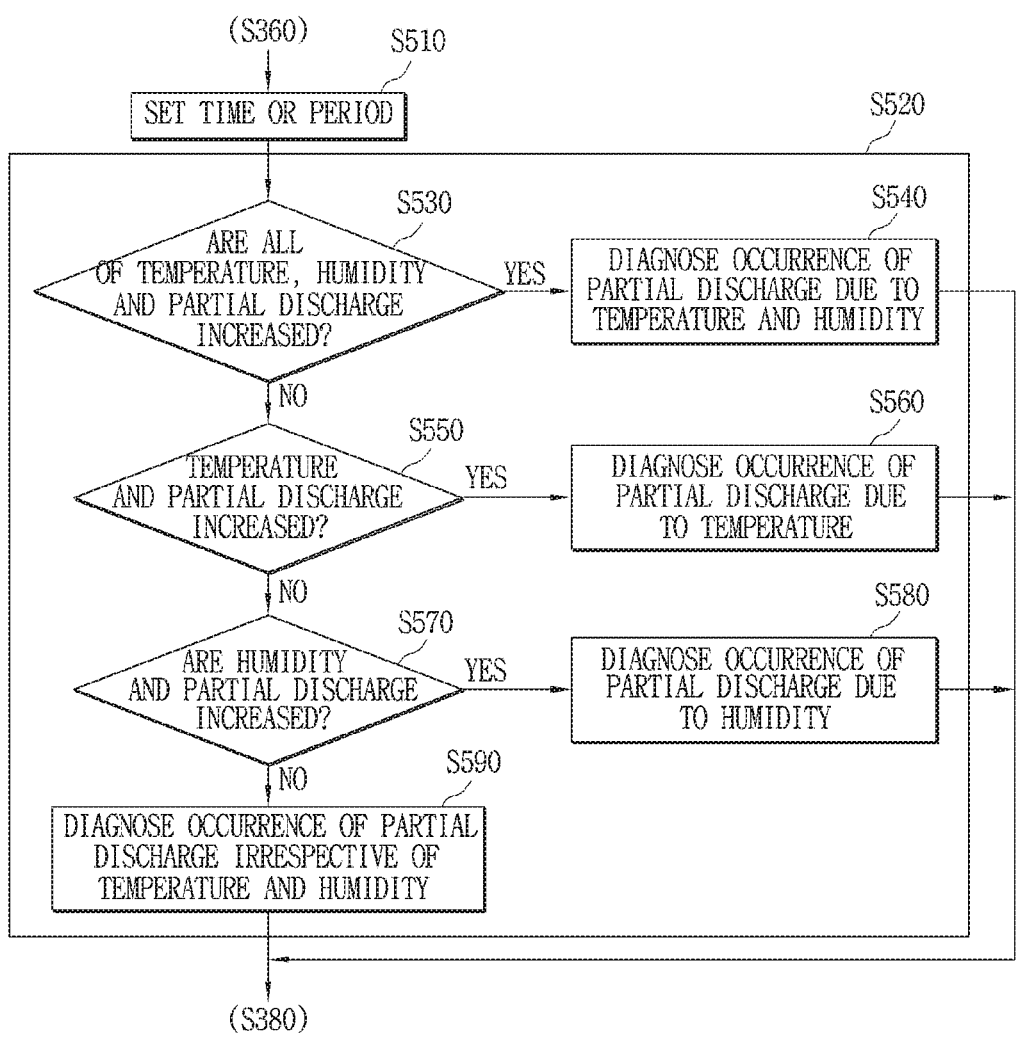
FIG. 3 is a flowchart showing S370 of FIG. 2 in more detail.

FIG. 3 is a flowchart showing S370 of FIG. 2 in more detail.

Referring to FIG. 3, the control module 190 can set a time or a period by input of the input module 130 (S510).

The control module 190 can analyze a temperature change amount, a humidity change amount, a partial discharge change amount for the time or the period set in S510, by applying them to the analysis algorithm (S520).

That is, in S520, the control module 190 can determine whether a temperature change and a humidity change have increasing trends, and whether an occurrence frequency of a partial discharge (the first noise signal) has an increasing trend (S530).

If the temperature change and the humidity change have increasing trends and the occurrence frequency of the partial discharge (the first noise signal) also has the increasing trend, the control module 190 can diagnose that the partial discharge (the first noise signal) has resulted from a temperature and a humidity (S540).

After S530, if all of the temperature change, the humidity change and the occurrence frequency of the partial discharge (the first noise signal) do not have the increasing trend, the control module 190 can determine whether the change trend of the partial discharge (the first noise signal) matches with the temperature change trend (whether both of the two change trends have increasing trends) (S550).

If both of the partial discharge change trend and the temperature change trend are increasing trends, the control module 190 can diagnose that the partial discharge (the first noise signal) has resulted from the temperature change (S560).

After S550, if the temperature change trend and the occurrence frequency trend of the partial discharge (the first noise signal) are not increasing trends, the control module 190 can determine whether the change trend of the partial discharge (the first noise signal) matches with the humidity change trend (whether the two change trends are increasing trends or not) (S570).

If the change of the occurrence frequency of the partial discharge (the first noise signal) matches with the humidity change (if both of the two changes are increased), the control module 190 may diagnose that the partial discharge (the first noise signal) has resulted from the humidity change (S580).

Finally, if the change trend of the occurrence frequency of the partial discharge (the first noise signal) does not match with the humidity change trend (if one of the two change trends is not increased), the control module 190 can diagnose that the partial discharge (the first noise signal) has not resulted from the temperature change and the humidity change (S590).

The foregoing embodiments are merely exemplary and are not to be considered as limiting the present disclosure.

In the electric power equipment according to the present invention, whether a partial discharge has occurred at the electric power equipment or not can be diagnosed based on a temperature signal, a humidity signal and first and second noise signals measured at the electric power equipment, and a status information can be displayed. This may allow a user to maintain and repair the electric power equipment before the electric power equipment is deteriorated and before an insulated state of the electric power equipment deteriorates. As a result, costs due to a replacement of the electric power equipment may be saved.

Further, in the electric power equipment according to the present invention, when a partial discharge of the electric power equipment is diagnosed, an occurrence cause of the partial discharge can be checked. This may allow the electric power equipment to undergo maintenance and repair according to a signal magnitude of the partial discharge.

What is claimed is:

1. An electric power equipment, comprising:
  a display module;
  a sensor module that outputs measurement data according to a first noise signal measured inside of the electric power equipment, a second noise signal measured outside of the electric power equipment, a temperature signal corresponding to a temperature of the electric power equipment, and a humidity signal corresponding to a humidity of the electric power equipment; and
  a control module that diagnoses whether a partial discharge has occurred on the electric power equipment based on the measurement data, and controls result information to be displayed on the display module if the partial discharge has occurred, the result information indicating an analysis result on the measurement data according to an analysis algorithm,
  wherein the control module comprises:
    a determination unit that determines whether a signal magnitude of the first noise signal is within a preset first reference range, if a signal magnitude difference between the first noise signal and the second noise signal is more than a preset reference difference value;
    an analysis unit that diagnoses an occurrence of the partial discharge when the signal magnitude of the first noise signal is within the preset first reference range, and analyzes the first noise signal, the temperature signal, and the humidity signal according to the analysis algorithm; and
    a control unit that controls the result information analyzed by the analysis unit, and first maintenance and repair information corresponding to the result information, to be displayed on the display module,
  wherein the control module further comprises a first pattern check unit that checks that the signal magnitude of the first noise signal is within a second reference range lower than the preset first reference range, and thereby diagnoses the occurrence of the partial discharge on the electric power equipment, if the signal magnitude of the first noise signal is out of the first reference range as a determination result by the determination unit, and the first pattern check unit outputs first noise pattern data including the signal magnitude, a phase and an occurrence frequency of the first noise signal,
  wherein the control module further comprises:
    a second pattern check unit that outputs second noise pattern data including the signal magnitude, the phase and the occurrence frequency of the first noise signal;
    a pattern determination unit that determines whether there exists a reference partial discharge pattern matching with the second noise pattern data; and
    an information generation unit that generates change amount information in relation to an amount of a temperature change amount and a humidity change amount for a preset time or period, and outputs the generated change amount information to the control unit, if there is no reference partial discharge pattern matching with the second noise pattern data,
  wherein if there exists the reference partial discharge pattern matching with the second noise pattern data, the analysis unit is configured to apply the occurrence frequency, the temperature change amount, and the humidity change amount of the first noise signal for the preset time or period, to the analysis algorithm, and output the result information indicating an analysis on whether the occurrence of the partial discharge is due to at least one of the temperature of the electric equipment and the humidity of the electric equipment,
  wherein if there is the reference partial discharge pattern matching the second noise pattern data, the control module:
    compares a change trend of the occurrence frequency of the first noise signal with a temperature change trend and a humidity change trend, based upon the analysis algorithm, for the preset time or period; and
    determines whether the first noise signal results from at least one of the temperature change amount and the humidity change amount,
  wherein if it is determined that the first noise signal results from at least one of the temperature change amount and the humidity change amount, the control module outputs the result information for maintaining and repairing a first component related to at least one of the temperature and the humidity, on the display module, and
  wherein if it is determined that the first noise signal does not result from at least one of the temperature change amount and the humidity change amount, the control module outputs the result information for maintaining and repairing a second component not related to the temperature and the humidity, on the display module.

2. The electric power equipment of claim 1, wherein the sensor module comprises:
  a first noise sensor that outputs the first noise signal;

a second noise sensor that outputs the second noise signal;
a temperature sensor that outputs the temperature signal; and
a humidity sensor that outputs the humidity signal.

3. The electric power equipment of claim 1, wherein the control unit is configured to control second maintenance and repair information corresponding to the first noise pattern data, to be displayed on the display module.

4. The electric power equipment of claim 3, wherein the second maintenance and repair information has priority for maintenance and repair, later than that of the first maintenance and repair information.

5. The electric power equipment of claim 1, wherein the control unit is configured to determine that the first noise signal is an inner noise signal which has not resulted from the partial discharge, based on the change amount information, generate noise information, and control the generated noise information on the display module to be displayed.

6. The electric power equipment of claim 1, further comprising a storage module that stores data according to the first noise signal and the second noise signal, the temperature signal, and the humidity signal in real time, and stores the result information and the first maintenance and repair information.

7. The electric power equipment of claim 1, further comprising an input module that inputs, to the control module, a command for setting the first reference range.

\* \* \* \* \*